(12) United States Patent
Jeong et al.

(10) Patent No.: US 11,676,915 B2
(45) Date of Patent: Jun. 13, 2023

(54) SEMICONDUCTOR PACKAGE

(71) Applicant: Samsung Electronics Co., Ltd., Suwon-si (KR)

(72) Inventors: Taesung Jeong, Osan-si (KR);
Doohwan Lee, Cheonan-si (KR);
Hongwon Kim, Suwon-si (KR);
Junggon Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 17/241,875

(22) Filed: Apr. 27, 2021

(65) Prior Publication Data
US 2022/0077078 A1   Mar. 10, 2022

(30) Foreign Application Priority Data
Sep. 4, 2020   (KR) .................. 10-2020-0113292

(51) Int. Cl.
*H01L 23/00* (2006.01)
*H01L 23/31* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............. H01L 21/4857; H01L 23/5383; H01L 23/5386; H01L 23/145; H01L 23/49822; H01L 23/485; H01L 23/31; H01L 23/481; H01L 23/5226; H01L 23/525; H01L 23/528; H01L 23/562; H01L 21/4853; H01L 21/563; H01L 21/565; H01L 21/568; H01L 21/6835; H01L 23/3128; H01L 23/3135; H01L 23/5389; H01L 24/16; H01L 25/0655; H01L 25/105; H01L 2221/6835; H01L 2224/16227; H01L 2225/1035; H01L 2225/1058; H01L 2924/18161; H01L 2924/3512; H01L 24/13; H01L 24/20; H01L 24/32; H01L 24/48; H01L 24/73; H01L 24/81;
(Continued)

(56) References Cited

U.S. PATENT DOCUMENTS 9,741,690 B1   8/2017   Hsieh et al.
10,061,967 B2   8/2018   Baek et al.
(Continued)

FOREIGN PATENT DOCUMENTS

KR   1020180028920 A   3/2018

*Primary Examiner* — Selim U Ahmed
*Assistant Examiner* — Evan G Clinton
(74) *Attorney, Agent, or Firm* — Muir Patent Law, PLLC

(57) ABSTRACT

A semiconductor package including a redistribution substrate with a first insulating layer, one or more second insulating layers on the first insulating layer, and a plurality of redistribution layers. The first insulating layer includes a first photosensitive resin having an elongation of 60% or more and toughness of 70 mJ/mm$^3$ or more. The one or more second insulating layers include a second photosensitive resin having an elongation in a range of 10% to 40% and toughness of 40 mJ/mm$^3$.

18 Claims, 17 Drawing Sheets

(51) Int. Cl.
  *H01L 23/538* (2006.01)
  *H01L 25/10* (2006.01)
  *H01L 21/683* (2006.01)
  *H01L 21/48* (2006.01)
  *H01L 21/56* (2006.01)
  *H01L 25/065* (2023.01)

(52) U.S. Cl.
  CPC .......... *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 23/5389* (2013.01); *H01L 24/16* (2013.01); *H01L 25/0655* (2013.01); *H01L 25/105* (2013.01); *H01L 2221/6835* (2013.01); *H01L 2224/16227* (2013.01); *H01L 2225/1035* (2013.01); *H01L 2225/1058* (2013.01); *H01L 2924/18161* (2013.01); *H01L 2924/3512* (2013.01)

(58) Field of Classification Search
  CPC ................. H01L 24/83; H01L 24/92; H01L 2224/05559; H01L 2221/68345; H01L 2224/0401; H01L 2224/04105; H01L 2224/12105; H01L 2224/16238; H01L 2224/32225; H01L 2224/48227; H01L 2224/73204; H01L 2224/81005; H01L 2224/81815; H01L 2224/83005; H01L 2224/85005; H01L 2224/92125; H01L 2225/1023; H01L 2924/15192; H01L 2924/15311; H01L 2924/1533; H01L 23/49816; H01L 24/06; H01L 24/09
  See application file for complete search history.

(56) References Cited

U.S. PATENT DOCUMENTS

| | | | |
|---|---|---|---|
| 10,157,871 B1* | 12/2018 | Yu | ............ H01L 21/568 |
| 10,490,521 B2 | 11/2019 | Hu et al. | |
| 10,515,888 B2 | 12/2019 | Ting et al. | |
| 10,522,471 B2 | 12/2019 | Suk et al. | |
| 2008/0057696 A1* | 3/2008 | Zhao | ............ H01L 23/562 |
| | | | 438/618 |
| 2009/0182114 A1* | 7/2009 | Kusaka | ............ C07D 307/93 |
| | | | 528/289 |
| 2013/0200528 A1* | 8/2013 | Lin | ............ H01L 23/562 |
| | | | 257/774 |
| 2016/0013148 A1* | 1/2016 | Lin | ............ H01L 24/19 |
| | | | 257/773 |
| 2018/0222164 A1* | 8/2018 | Iwai | ............ G03F 7/027 |
| 2018/0269145 A1 | 9/2018 | Paek et al. | |
| 2020/0075492 A1 | 3/2020 | Choi et al. | |

* cited by examiner

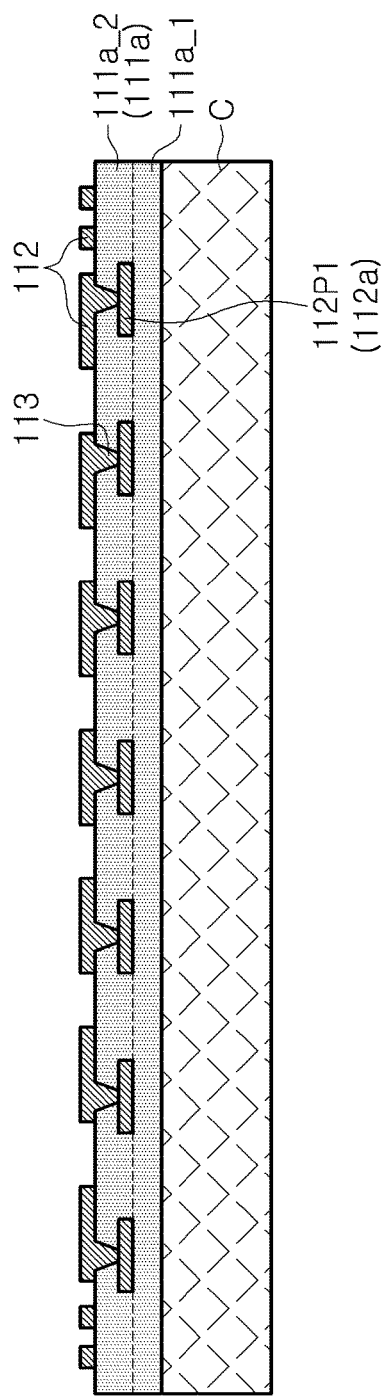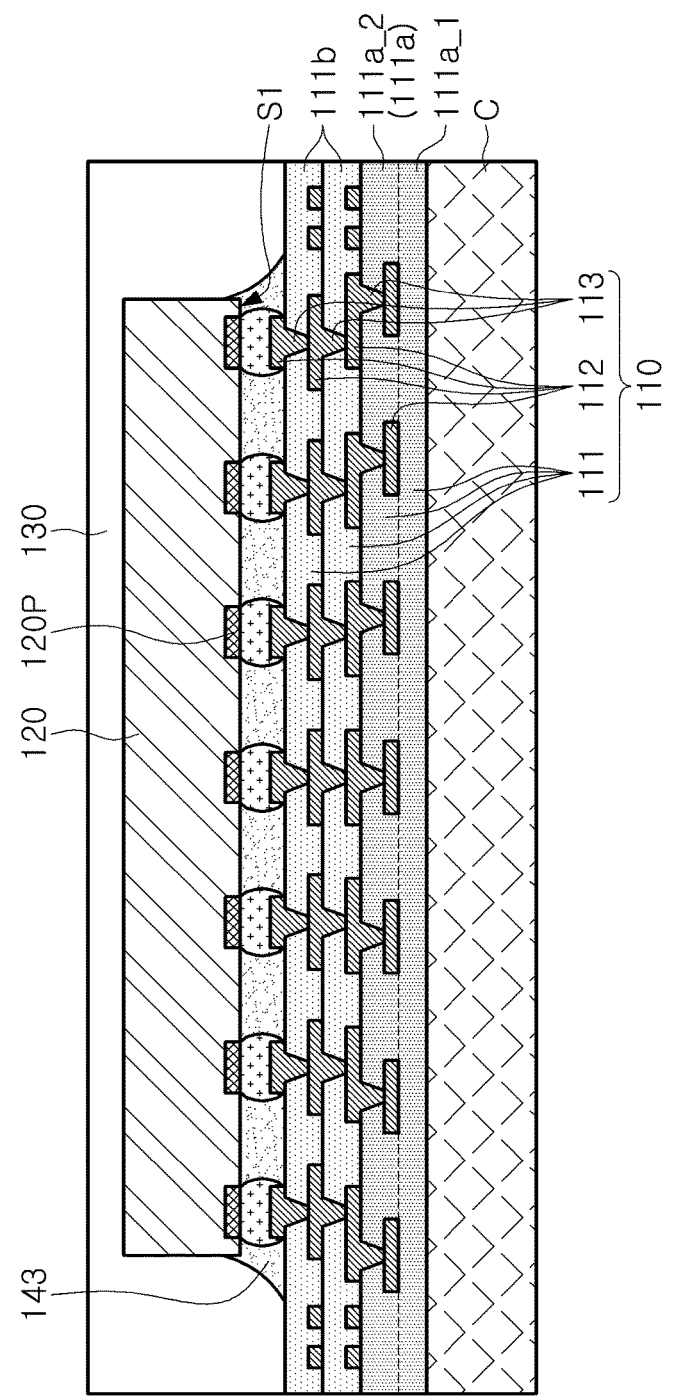
FIG. 6C
FIG. 6D

SEMICONDUCTOR PACKAGE

CROSS-REFERENCE TO RELATED APPLICATION

This application claims the priority and benefit of Korean Patent Application No. 10-2020-0113292 filed on Sep. 4, 2020, with the Korean Intellectual Property Office, the contents of which are herein incorporated by reference in their entirety.

BACKGROUND

1. Field

The present inventive concept relates to a semiconductor package.

2. Description of Related Art

A semiconductor package is mounted on a substrate (e.g., a mainboard) through connection bumps such as solder balls, or the like. Reliability of the semiconductor package is affected by the connection bump and a connection state of the semiconductor package. In order to guarantee the reliability of the semiconductor package, a technology capable of preventing cracks occurring in an insulating material layer around a connection bump is required.

SUMMARY

An aspect of the present inventive concept is to provide a semiconductor package having improved reliability.

According to an aspect of the present inventive concept, a semiconductor package, includes: a redistribution substrate including a first insulating layer, one or more second insulating layers on the first insulating layer, and a plurality of redistribution layers disposed on each of the first insulating layer and the one or more second insulating layers and electrically connected to each other; a semiconductor chip disposed on the redistribution substrate, and including a connection pad electrically connected to the plurality of redistribution layers; an encapsulant disposed on the redistribution substrate, and covering the semiconductor chip; a first connection bump disposed on the redistribution substrate opposite to the semiconductor chip, and electrically connected to the plurality of redistribution layers; and a second connection bump disposed between the redistribution substrate and the semiconductor chip, and electrically connecting the plurality of redistribution layers and the connection pad, wherein the first insulating layer includes a first photosensitive resin, the first photosensitive resin having an elongation of 60% or more and toughness of 70 mJ/mm$^3$ or more, wherein the one or more second insulating layers include a second photosensitive resin, the second photosensitive resin having an elongation in a range of 10% to 40% and toughness in a range of 10 mJ/mm$^3$ to 40 mJ/mm$^3$.

In addition, according to an aspect of the present inventive concept, a semiconductor package includes: a redistribution substrate including a first insulating layer and a second insulating layer stacked in a vertical direction, and a redistribution layer disposed in the first insulating layer and the second insulating layer; a semiconductor chip having a first surface on which a connection pad is disposed, and disposed on the redistribution substrate in such a manner that the first surface faces the second insulating layer; and an encapsulant covering the redistribution substrate and the semiconductor chip, wherein the first insulating layer includes a first insulating resin, the second insulating layer includes a second insulating resin, and the first insulating resin has elongation and toughness greater than the second insulating resin.

In addition, according to an aspect of the present inventive concept, a semiconductor package includes: a redistribution substrate including one or more first insulating layers, one or more second insulating layers stacked on the one or more first insulating layers, and a plurality of redistribution layers disposed in the one or more first and second insulating layers; and a first semiconductor chip disposed on the redistribution substrate, and including a first connection pad electrically connected to the plurality of redistribution layers, wherein the one or more first insulating layers include a first insulating resin, the one or more second insulating layers include a second insulating resin, the first insulating rein having an elongation of 60% or more and toughness of 70 mJ/mm$^3$ or more.

BRIEF DESCRIPTION OF DRAWINGS

The above and other aspects, features, and advantages of the present inventive concept will be more clearly understood from the following detailed description taken in conjunction with the accompanying drawings, in which:

FIGS. 6A to 6E are cross-sectional views schematically illustrating a method of manufacturing the semiconductor package of FIG. 4;

DETAILED DESCRIPTION

Hereinafter, preferred example embodiments of the present inventive concept will be described with reference to the accompanying drawings as follows.

Figure 1A:
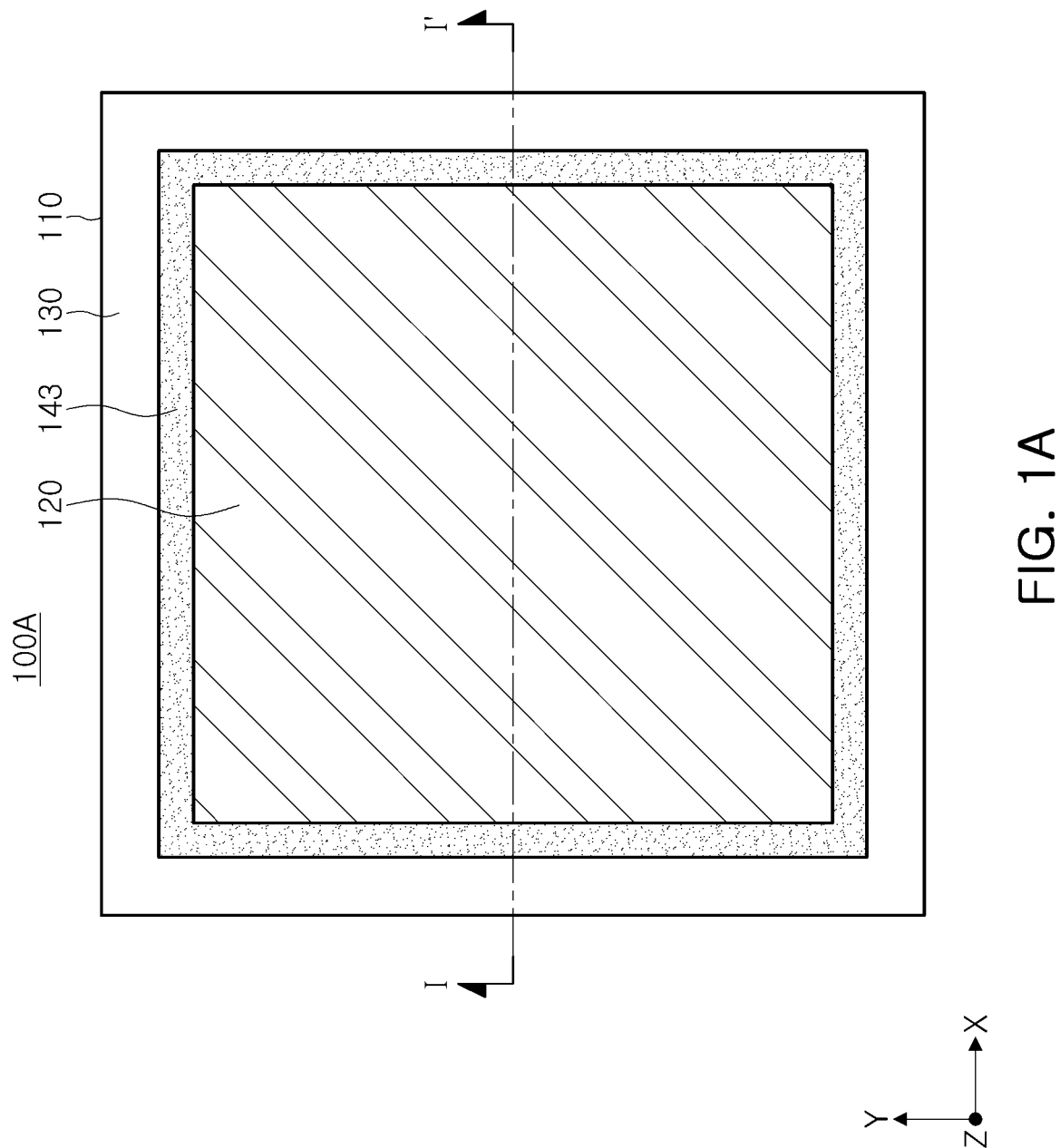
FIG. 1A is a cross-sectional view illustrating a semiconductor package according to an example embodiment of the present inventive concept.
Figure 1B:
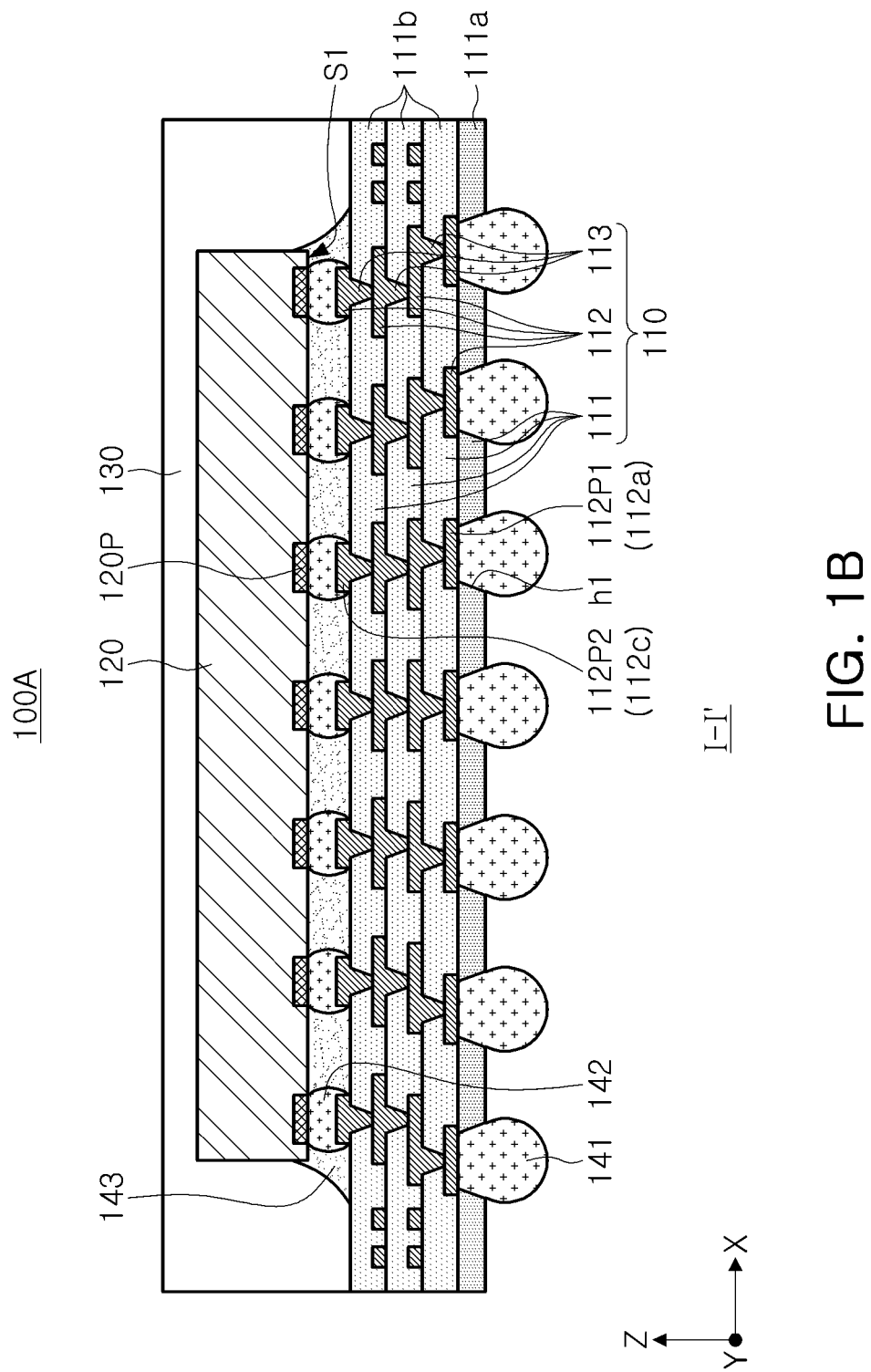
FIG. 1B is a cross-sectional view of a plane taken along line I-I' of FIG. 1A.

FIG. 1A is a cross-sectional view illustrating a semiconductor package according to an example embodiment of the present inventive concept, and FIG. 1B is a cross-sectional view of a plane taken along line I-I' of FIG. 1A.

Referring to FIGS. 1A and 1B, the semiconductor package 100A may include a redistribution substrate 110, a semiconductor chip 120, and an encapsulant 130. The semiconductor package 100A may further include first and second connection bumps 141 and 142 and an underfill resin 143.

The redistribution substrate 110 is a support substrate on which the semiconductor chip structure 120 is mounted, and may include an insulating layer 111, a redistribution layer 112, and a redistribution via 113. The insulating layer 111 may include a plurality of insulating layers 111 stacked in a vertical direction (Z direction). For example, the insulating layer 111 may include a first insulating layer 111a and one or more second insulating layers 111b stacked on the first insulating layer 111a. The insulating layer 111 may include or may be formed of an insulating resin. The insulating resin may include a thermosetting resin such as an epoxy resin, a thermoplastic resin such as polyimide, or a resin impregnated with inorganic fillers or/and glass fibers (Glass Fiber, Glass Cloth, Glass Fabric) being provided therein, for example, prepreg, Ajinomoto Build-up Film (ABF), FR-4, and Bismaleimide Triazine (BT). In addition, the insulating layer 111 may include or may be formed of a photosensitive resin such as a photoimageable dielectric (PID) resin. When the insulating layer 111 is formed of a PID, the insulating layer 111 has photosensitive properties. Accordingly, the insulating layer 111 may be formed to be thinner, and a fine redistribution layer and a redistribution via 113 may be formed. The photosensitive resin (e.g., PID) may be formed of or include an insulating resin and an inorganic filler. Both the first insulating layer 111a and the second insulating layer 111b may include or may be formed of a photosensitive resin. Depending on the process, a boundary between the insulating layers 111 of different levels may be imperceptible. The photosensitive resin is defined as a polymer that changes its properties, for example hardening, when exposed to light. The photosensitive resin may include main resin (e.g., Polyhydroxystyrene, Polybenzoxazole, Polyimide, etc.), photo active compound (e.g., Dinaphthoquinone), crosslinker, additive (e.g., Adhesion promoter), and solvent.

In an example embodiment, an outermost insulating layer 111a of the redistribution substrate 110 includes an insulating resin having greater elongation and toughness than the insulating layers 111b stacked thereon. As a result, the reliability of the semiconductor package 100A may be improved by preventing the occurrence of cracks around the connection bump 141. For example, the first insulating layer 111a is an outermost insulating layer of the semiconductor package 100A. The first insulating layer 111a and one or more second insulating layers 111b stacked on the first insulating layer 111a may include a first insulating resin and a second insulating resin, respectively. In this case, the elongation and toughness of the second insulating resin may be less than the elongation and toughness of the first insulating resin. For example, the first insulating resin has an elongation of 60% or more and toughness of 70 mJ/mm$^3$ or more, and the second insulating resin has an elongation in a range of 10% to 40% and toughness of 10 mJ/mm$^3$ to 40 mJ/mm$^3$. For example, the first insulating resin may have an elongation in a range of 60% to 85% and toughness in a range of 70 mJ/mm$^3$ to 95 mJ/mm$^3$. Both the first insulating resin and the second insulating resin may include a photosensitive resin. Elongation is a measure of how far a material will stretch before it breaks and is expressed as a percentage that indicates the increase in length of a material from its resting (non-stressed) length. Toughness refers to an amount of energy per unit volume that a material can absorb before rupturing. The toughness and the elongation may be measured through a standard tensile test according to ASTM D882, or the like.

The redistribution layer 112 may include a plurality of redistribution layers 112 disposed on or in the insulating layer 111 at different levels. For example, the plurality of redistribution layers 112 may be disposed on or in the first insulating layer 111a and on or in at least one second insulating layer 111b, and may be electrically connected to each other. A lowermost redistribution layer 112a of the plurality of redistribution layers 112 may include a first pad 112P1 connected to the first connection bump 141, and an uppermost redistribution layer 112c of the plurality of redistribution layers 112 may include a second pad 112P2 connected to the second connection bump 142 and protruding on an uppermost second insulating layer among one or more second insulating layers 111b. In an example embodiment, the first pad 112P1 is buried in the lowermost second insulating layer among one or more second insulating layers 111b, and the first insulating layer 111a may have an opening h1 exposing at least a portion of the first pad 112P1.

The redistribution layer 112 may redistribute the connection pad 120P of the semiconductor chip 120. The redistribution layer 112 may include or may be formed of, for example, copper (Cu), aluminum (Al), silver (Ag), tin (Sn), gold (Au), nickel (Ni), lead (Pb), titanium (Ti), or a metal material including alloys thereof. The redistribution layer 112 may perform various functions depending on the design. For example, the redistribution layer 112 may include a ground (GND) pattern, a power (PWR) pattern, a signal (S) pattern, and the like. The signal S pattern may include various signals, for example, a data signal, excluding a ground (GND) pattern, a power (PWR) pattern, and the like.

The redistribution via 113 may penetrate through at least a portion of the second insulating layers 111b and connect the plurality of redistribution layers 112 to each other. In varying embodiments, the redistribution via 113 may penetrate through the first insulating layer 111a and at least a portion of the one or more second insulating layers 111b to electrically connect a plurality of redistribution layers 112 located on different levels. The redistribution via 113 may include a signal via, a ground via, and a power via. The redistribution via 113 may include or may be formed of, for example, copper (Cu), aluminum (Al), silver (Ag), tin (Sn), gold (Au), nickel (Ni), lead (Pb), titanium (Ti), or a metal material including alloys thereof. The redistribution via 113 may have a form of a filled via filled with a metal material, or a conformal-type via in which the metal material is formed along an inner wall surface of the via hole.

The semiconductor chip 120 may be disposed on an upper surface of the redistribution substrate 110, and may include a connection pad 120P electrically connected to the redistribution layer 112. The semiconductor chip 120 may be mounted on the redistribution substrate 110 in a flip-chip bonding method. For example, the semiconductor chip 120 may be disposed such that a first surface S1 on which the connection pad 120P is disposed faces an upper surface of the redistribution substrate 110, and the connection pad 120P may be connected to a second pad 112P2 of the redistribution layer 112 through a second connection bump 142. The second connection bump 142 may have a pad shape, a ball shape, or a pin shape. The second connection bump 142 may include or may be formed of, for example, tin (Sn) or an alloy (e.g., Sn—Ag—Cu) including tin (Sn). The connection pad 120P may include or may be formed of a metal material, for example, aluminum (Al), or the like.

The semiconductor chip 120 may be a logic chip or a memory chip. The logic chip may include, for example, a central processing unit (CPU), a graphics processing unit (GPU), a field programmable gate array (FPGA), a digital signal processor, an encryption processor, a microprocessor, a microcontroller, an analog-digital converter, an application-specific IC (ASIC), or the like. The memory chip may include a volatile memory device such as a dynamic RAM (DRAM), a static RAM (SRAM), and the like or a nonvolatile memory device such as a phase change RAM (PRAM), a magnetic RAM (MRAM), a resistive RAM (RRAM), a flash memory, and the like. Alternatively, the semiconductor chip 120 may be mounted on the redistribution structure 110 in a wire bonding method.

The encapsulant 130 may be formed on the redistribution substrate 110, and may cover at least a portion of the semiconductor chip 120. The encapsulant 130 may include or may be formed of a thermosetting insulating resin such as an epoxy resin, a thermoplastic insulating resin such as a polyimide, or prepreg including an inorganic filler and/or a glass fiber, an Ajinomoto Build-up Film (ABF), FR-4, a bismaleimide triazine (BT) resin, an epoxy molding compound (EMC), and the like.

First and second connection bumps 141 and 142 may have a pad shape, a ball shape, or a pin shape. The first and second connection bumps 141 and 142 may include or may be formed of, for example, tin (Sn) or an alloy (e.g., Sn—Ag—Cu) containing tin (Sn). The first connection bump 141 may be disposed on the lower surface of the redistribution substrate 110, opposite to the semiconductor chip 120, and may be electrically connected to the redistribution layer 112. The first connection bump 141 may physically and/or electrically connect the semiconductor package 100A to an external device. The first connection bump 141 may include, for example, a solder ball. The second connection bump 142 may be disposed between the upper surface of the redistribution substrate 110 and the semiconductor chip 120, and may electrically connect the redistribution layer 112 and the connection pad 120P. The second connection bump 142 may have various shapes like the first connection bump 141, and may include a low-melting point metal including tin, or the like. An underfill resin 143 may fill a space between the redistribution substrate 110 and the semiconductor chip 120, and may be formed to surround the second connection bump 142. The underfill resin 143 may include an insulating resin such as an epoxy resin. The underfill resin 143 may be a portion of the encapsulant 130 formed in a molded under-fill (MUF) method.

FIGS. 2A to 2D are cross-sectional views schematically illustrating a method of manufacturing the semiconductor package 100A of FIG. 1B.

Figure 2A:
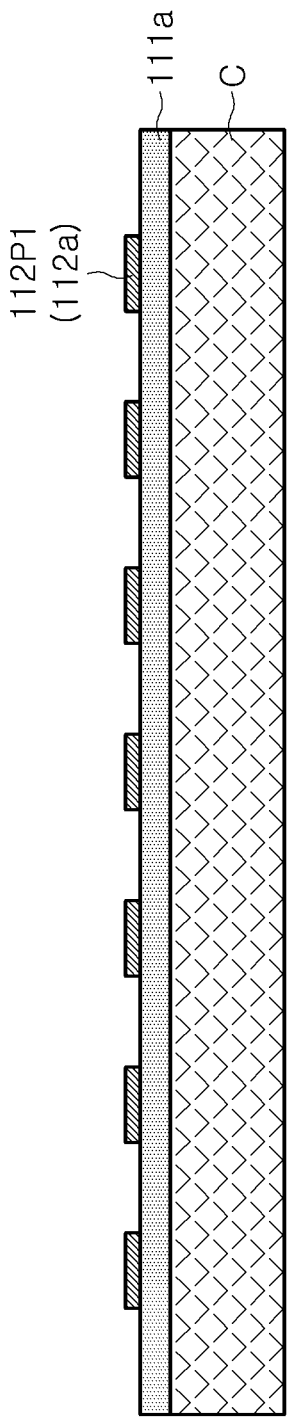
FIGS. 2A to 2D are cross-sectional views schematically illustrating a method of manufacturing the semiconductor package of FIG. 1B.

Referring to FIG. 2A, a first insulating layer 111a and a patterned redistribution layer 112a may be formed on a carrier C. For example, the first insulating layer 111a may include a first photosensitive resin having an elongation of 60% or more and toughness of 70 mJ/mm$^3$ or more. The first insulating layer 111a is the outermost insulating layer of the package, and may have higher elongation and toughness than the inner insulating layers. The first insulating layer 111a may be formed by coating and curing a photosensitive resin. The redistribution layer 112a may be formed using a photo process, an etching process, and a plating process.

Figure 2B:
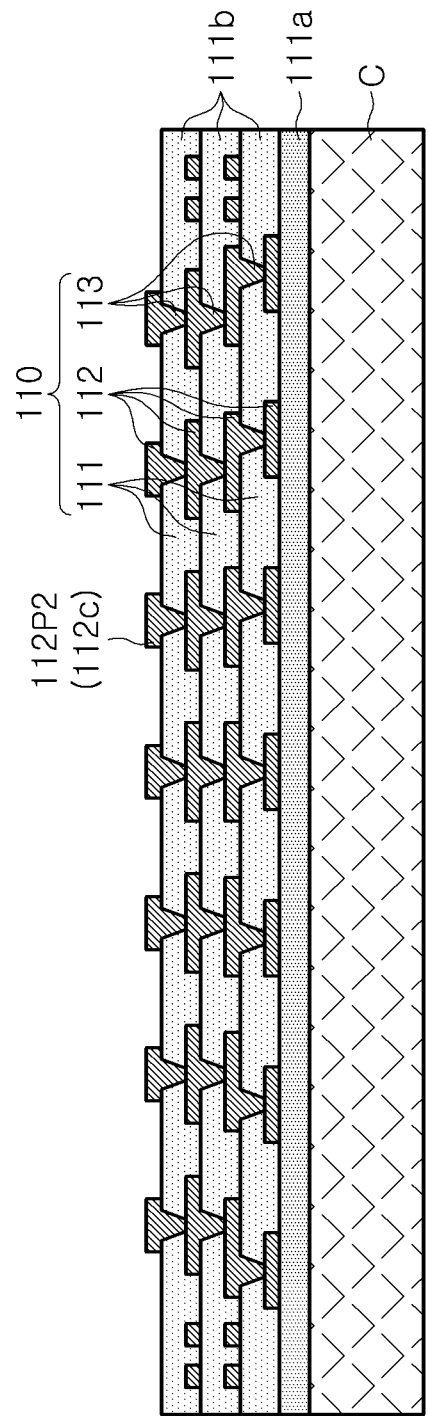

Referring to FIG. 2B, a plurality of second insulating layers 111b, a redistribution layer 112, and a redistribution via 113 may be formed on the first insulating layer 111a to complete a redistribution substrate 110. For example, the second insulating layers 111b may include a second photosensitive resin having an elongation in a range of 10% to 40% and toughness in a range of 10 mJ/mm$^3$ to 40 mJ/mm$^3$. The second insulating layers 111b may include a photosensitive resin having relatively smaller toughness and elongation than the first insulating layer 111a. Accordingly, it is possible to improve the reliability of the package by minimizing an increase in manufacturing costs, and preventing the occurrence of cracks in the outermost insulating layer. The second insulating layers 111b and the redistribution layer 112 may be formed by repeating the process described in FIG. 2A. The redistribution via 113 may be formed by filling a via hole formed by a photo process and an etching process with a metal material through a plating process. The redistribution via 113 may be formed by the same plating process as the adjacent redistribution layer 112.

Figure 2C:
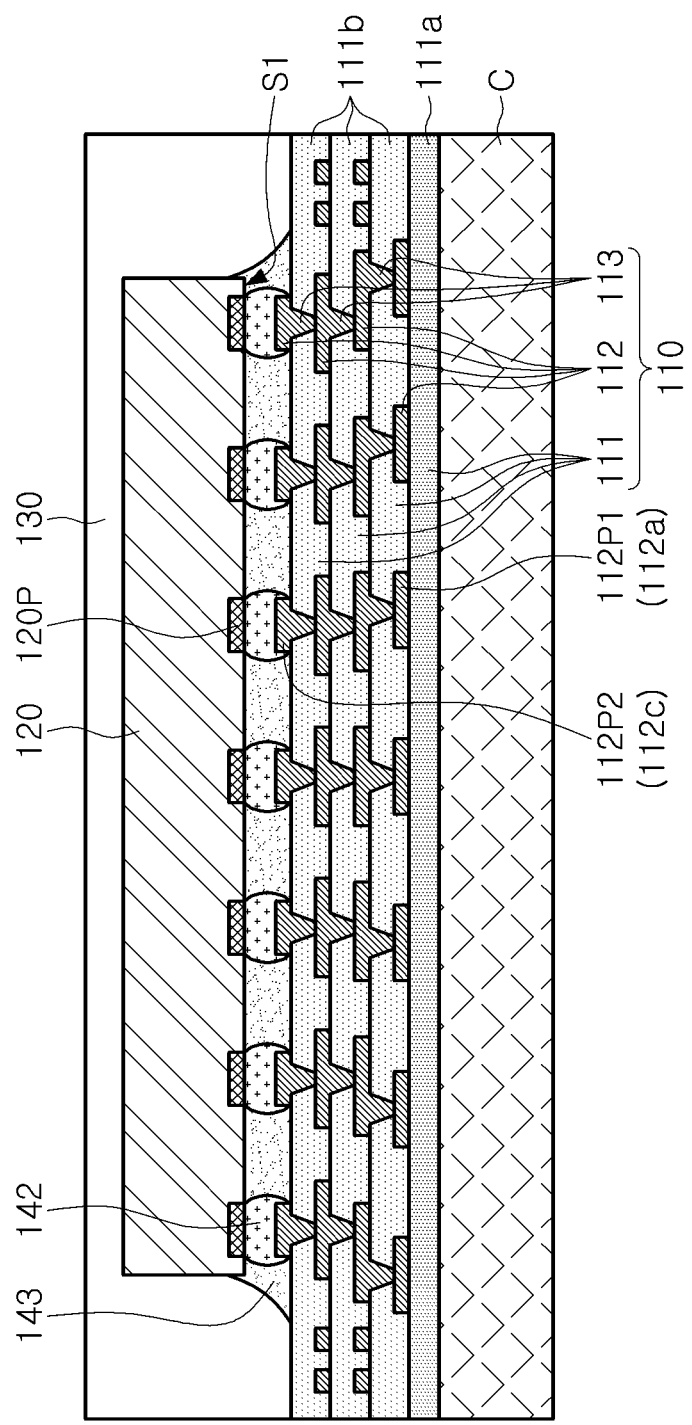

Referring to FIG. 2C, the semiconductor chip 120 may be mounted on the redistribution substrate 110, and the encapsulant 130 may be formed. The semiconductor chip 120 may be connected to the second pad 112P2 through a second connection bump 142. The second connection bump 142 may be formed through a reflow process. The encapsulant 130 may be formed by laminating and then curing a liquid precursor, or heating and curing a film-type precursor. An underfill resin 143 may be formed between the semiconductor chip 120 and the redistribution substrate 110 before forming the encapsulant 130. The underfill resin 143 may be omitted or formed integrally with the encapsulant 130 so that a boundary therebetween may be imperceptible.

Figure 2D:
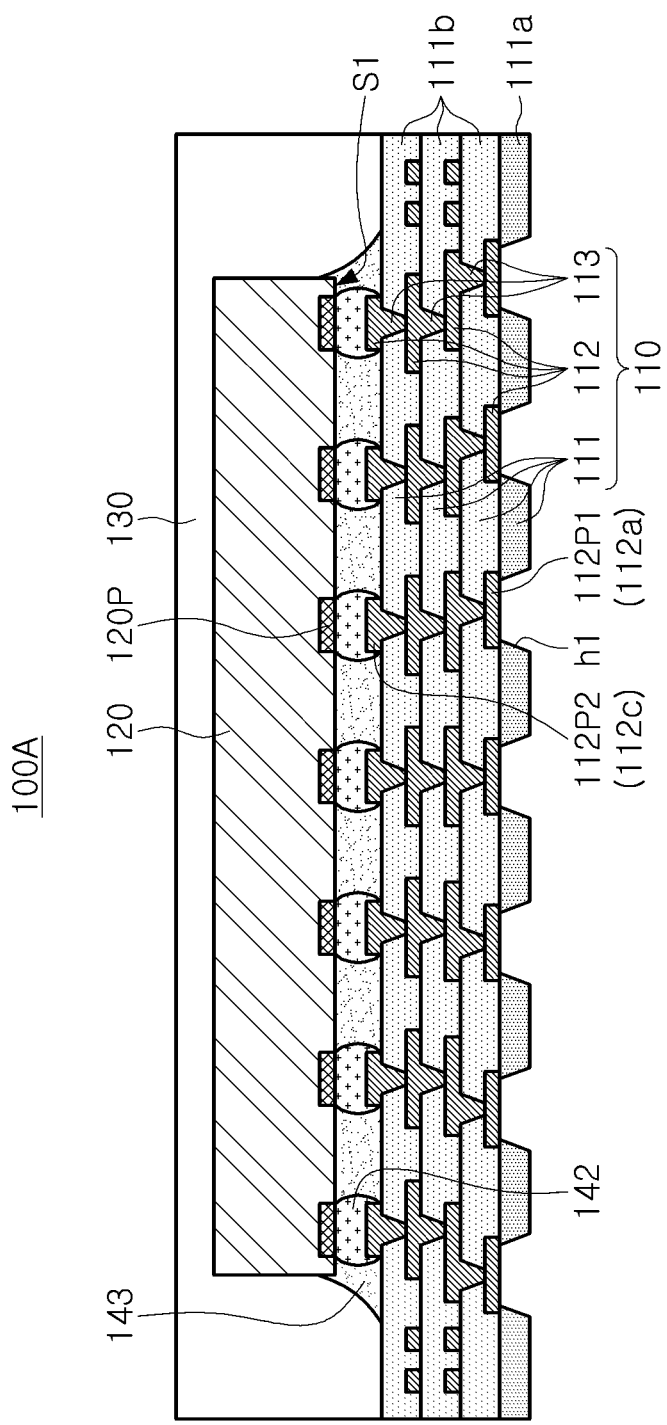

Referring to FIG. 2D, after removing the carrier C of FIG. 2C, a plurality of openings h1 penetrating through the first insulating layer 111a may be formed. The opening h1 may expose at least a portion of the lowermost redistribution layer 112a. Thereafter, a solder ball or/and under bump metal may be formed in the opening h1 to be electrically connected to the redistribution layer 112.

Figure 3A:
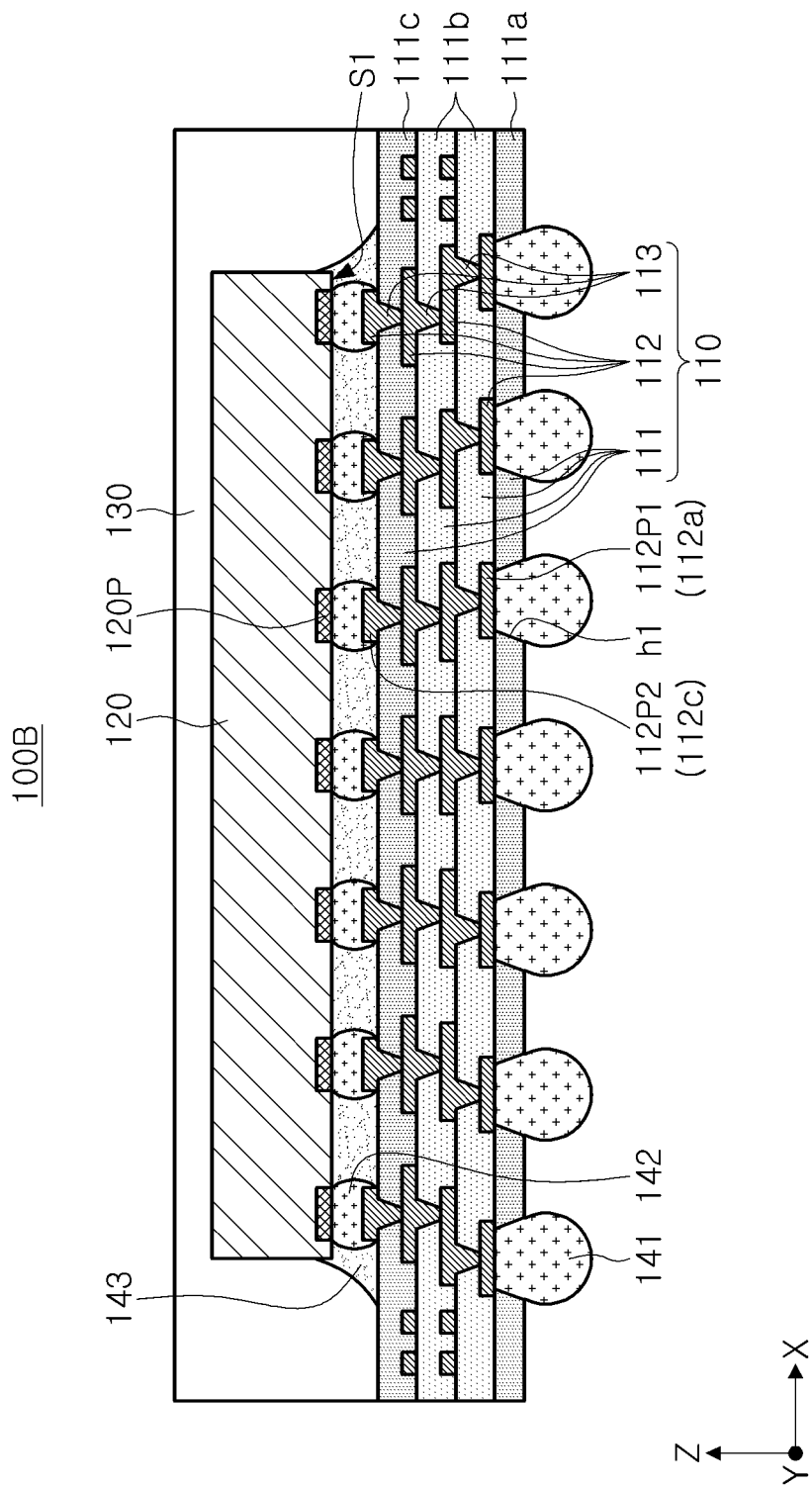
FIGS. 3A and 3B are cross-sectional views illustrating a semiconductor package according to an example embodiment of the present inventive concept.
Figure 3B:
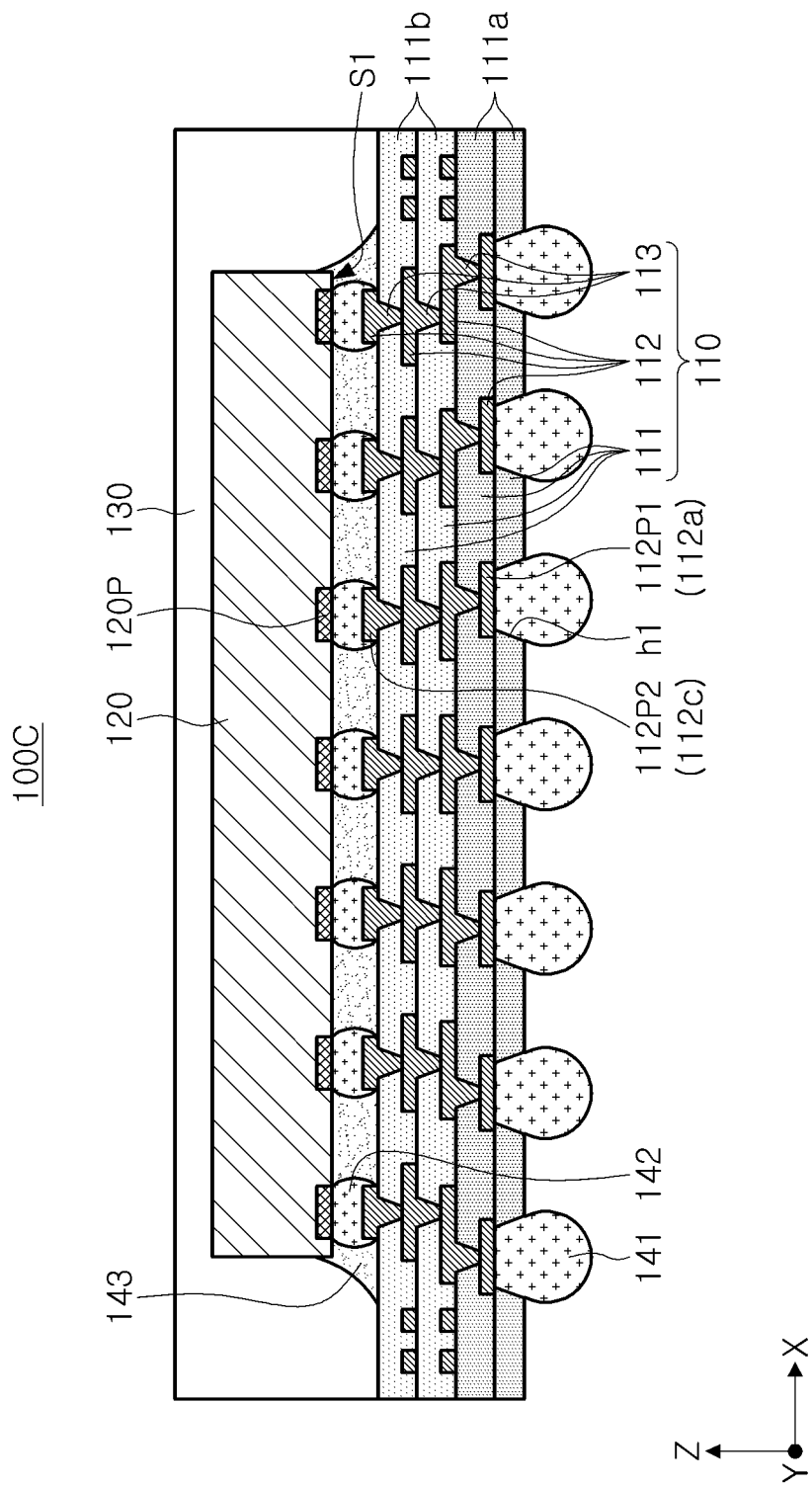

FIGS. 3A and 3B are cross-sectional views illustrating semiconductor packages 100B and 100C, respectively, according to an example embodiment of the present inventive concept.

Referring to FIG. 3A, a semiconductor package 100B may include a redistribution substrate 110 further including a third insulating layer 111c disposed on the one or more second insulating layers 111b. In addition, an outermost redistribution layer 112c among the plurality of redistribution layers 112 may include a second pad 112P2 connected to the second connection bump 142 and protruding on a third insulating layer 111c. In an example embodiment, the third insulating layer 111c may include the same insulating resin as the first insulating layer 111a. For example, the first insulating layer 111a and the third insulating layer 111c may include or may be formed of a photosensitive resin having an elongation of 60% or more and toughness of 70 mJ/mm$^3$ or more. Accordingly, it is possible to prevent cracks from occurring in the uppermost and lowermost insulating layers of the redistribution substrate 110.

Referring to FIG. 3B, in a semiconductor package 100C, the redistribution substrate 110 may include one or more first insulating layers 111a, one or more second insulating layers 111b stacked on the one or more first insulating layers 111a, and a plurality of redistribution layers 112 disposed in first and second insulating layers 111a and 111b. For example, the first insulating layer 111a and the second insulating layer 111b may include a plurality of (e.g., two) first insulating layers 111a and second insulating layers 111b, respectively, stacked in a vertical direction (Z direction). In an example embodiment, by providing a plurality of first insulating layers 111a having relatively high elongation and toughness, it is possible to more effectively prevent cracking from occurring.

Figure 4:
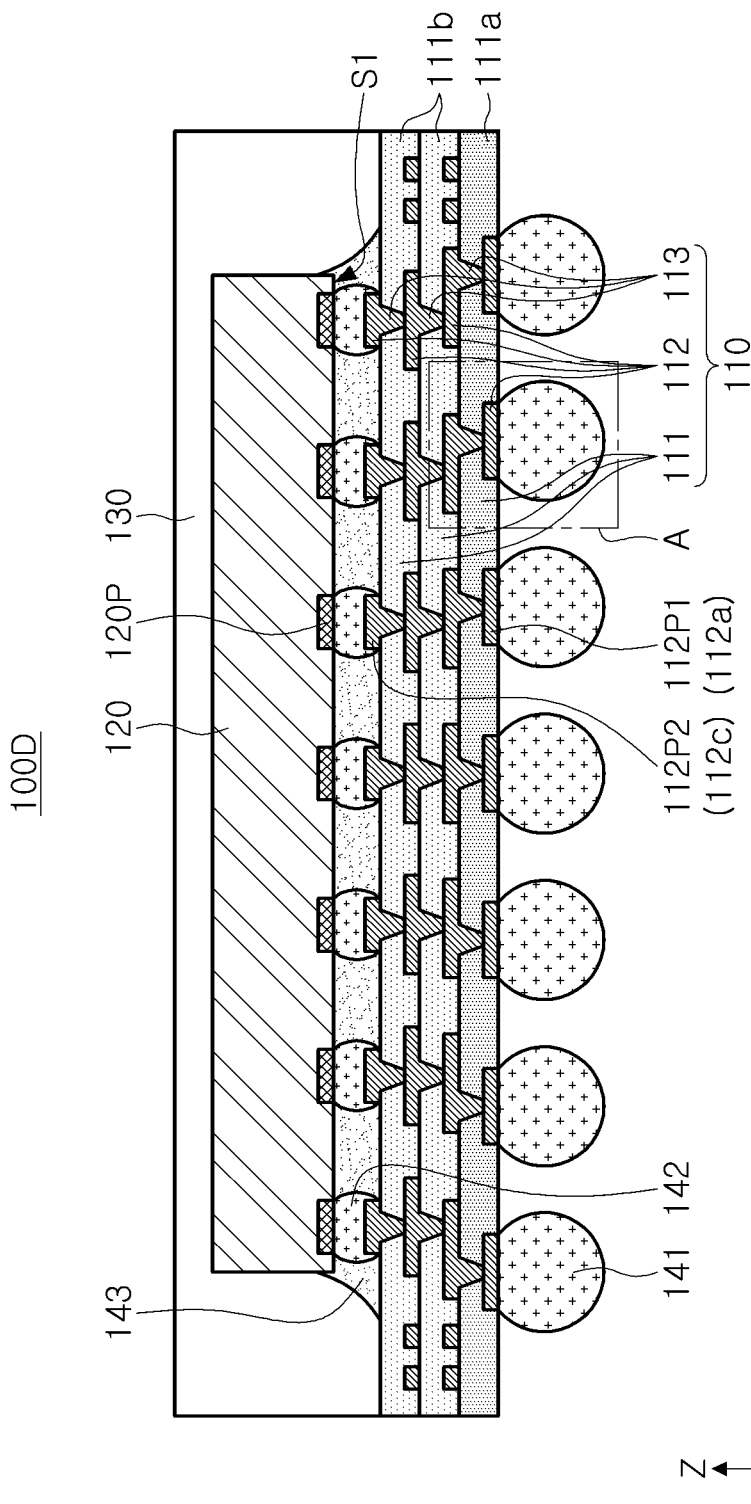
FIG. 4 is a cross-sectional view illustrating a semiconductor package according to an example embodiment of the present inventive concept.
Figure 5:
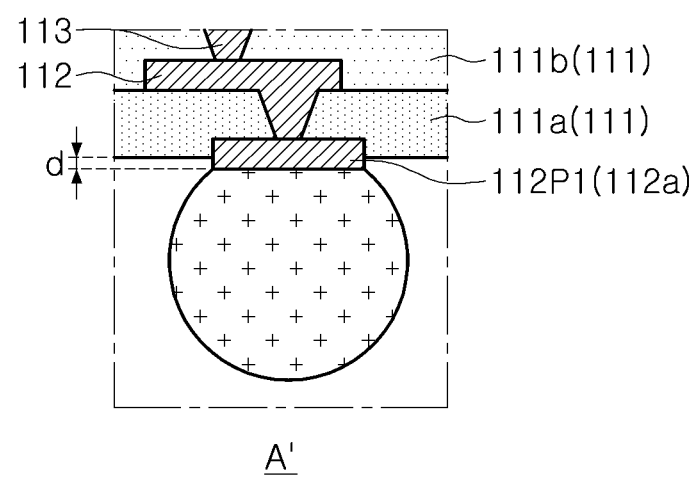
FIG. 5 is a partially enlarged view showing a modified example of the semiconductor package of FIG. 4.

FIG. 4 is a cross-sectional view illustrating a semiconductor package 100D according to an example embodiment of the present inventive concept, and FIG. 5 is a partially enlarged view showing a modified example of the semiconductor package of FIG. 4. FIG. 5 shows some components corresponding to region "A" of FIG. 4.

Referring to FIG. 4, in a semiconductor package 100D, a lowermost redistribution layer 112a of the plurality of redistribution layers 112 may include a first pad 112P1 connected to the first connection bump 141, and the first pad 112P1 is buried in the first insulating layer 111a, and a lower surface of the first insulating layer 111a may be positioned on substantially the same level as a lower surface of the first pad 112P1 or located between an upper surface and the lower surface of the first pad 112P1. For example, the first pad 112P1 may be buried in the first insulating layer 111a such that the lower surface thereof is substantially coplanar with the lower surface of the first insulating layer 111a. The first pad 112P1 may be connected to a redistribution layer 112 on the first insulating layer 111a through the redistribution via 113 penetrating through the first insulating layer 111a. The term "coplanar," as used herein encompass identicality or near identicality including variations that may occur, for example, due to manufacturing processes. The term "substantially" may be used herein to emphasize this meaning, unless the context or other statements indicate otherwise.

In addition, referring to FIG. 5, in a modified example, a lower surface of the first insulating layer 111a may have a step d from the lower surface of the first pad 112P1. For example, the lower surface of the first insulating layer 111a may be positioned at a level between the lower surface and the upper surface of the first pad 112P1. In an example embodiment, since the lower surface of the first pad 112P1 is completely exposed from the first insulating layer 111a, connection reliability between the first connection bump 141 and the first pad 112P1 may be guaranteed.

FIGS. 6A to 6E are cross-sectional views schematically illustrating a method of manufacturing the semiconductor package 100D of FIG. 4.

Figure 6A:
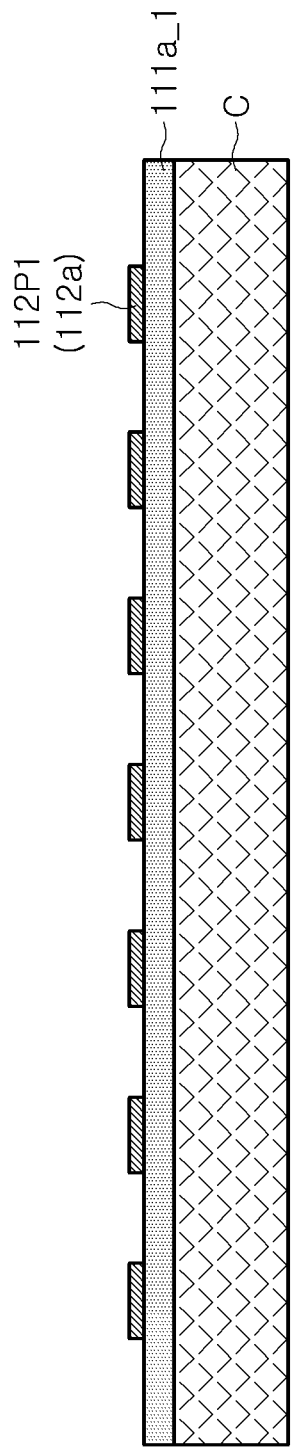

Referring to FIG. 6A, a first lower insulating layer 111a_1 and a patterned redistribution layer 112a may be formed on a carrier C. The first lower insulating layer 111a_1 may include the same insulating resin as the first insulating layer 111a of FIG. 4. The insulating resin of the first lower insulating layer 111a_1 may be different from the second insulating layer 111b of FIG. 4. For example, the first lower insulating layer 111a_1 may include or may be formed of a first photosensitive resin having an elongation of 60% or more and toughness of 70 mJ/mm$^3$ or more. The first lower insulating layer 111a_1 may be formed by coating and curing a photosensitive resin. The redistribution layer 112a may be formed using a photo process, an etching process, and a plating process.

Figure 6B:
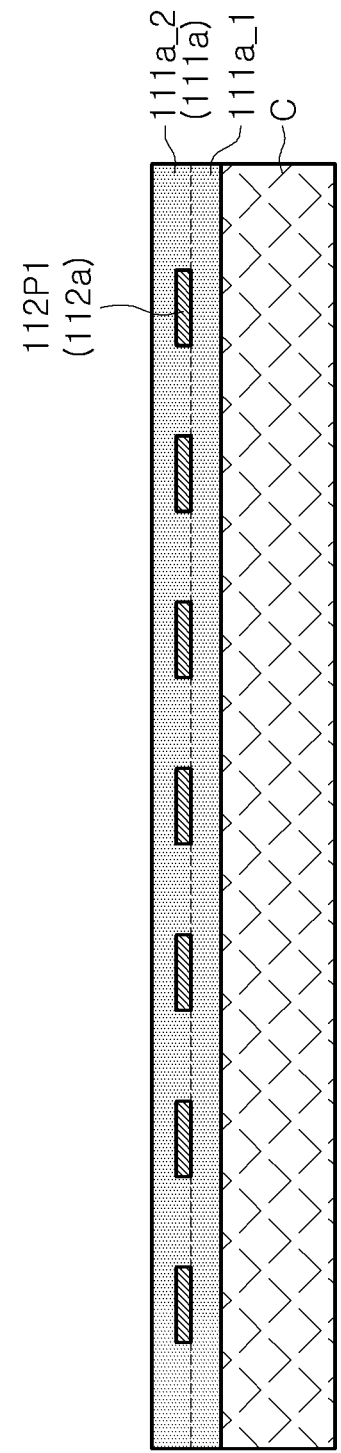

Referring to FIG. 6B, a first upper insulating layer 111a_2 covering the first lower insulating layer 111a_1 and the patterned redistribution layer 112a may be formed. The first upper insulating layer 111a_2 is an outermost insulating layer of a package corresponding to the first insulating layer 111a of FIG. 4, and may have higher elongation and toughness than those of the inner insulating layers. For example, the first upper insulating layer 111a_2 may include a first photosensitive resin having an elongation of 60% or more and toughness of 70 mJ/mm$^3$ or more.

Referring to FIG. 6C, a redistribution layer 112 on the first upper insulating layer 111a_2 and a redistribution via 113 penetrating through the first upper insulating layer 111a_2 may be formed. The redistribution via 113 may be formed by filling a via hole formed by a photo process and an etching process with a metal material through a plating process. The redistribution via 113 may be formed by the same plating process as the adjacent redistribution layer 112.

Referring to FIG. 6D, a plurality of second insulating layers 111b, a plurality of redistribution layers 112, and a plurality of redistribution vias 113 may be formed on the first upper insulating layer 111a_2 to complete a redistribution substrate 110. For example, the second insulating layers 111b may include a second photosensitive resin having an elongation in a range of 10% to 40% and toughness in a range of 10 mJ/mm$^3$ to 40 mJ/mm$^3$. The second insulating layers 111b may include a photosensitive resin having relatively smaller toughness and elongation than the first lower insulating layer 111a1 and the first upper insulating layer 111a_2. Thereafter, the semiconductor chip 120 may be mounted on the redistribution substrate 110 and the encapsulant 130 may be formed. These may be formed in substantially the same manner as described in FIGS. 2B and 2C.

Figure 6E:
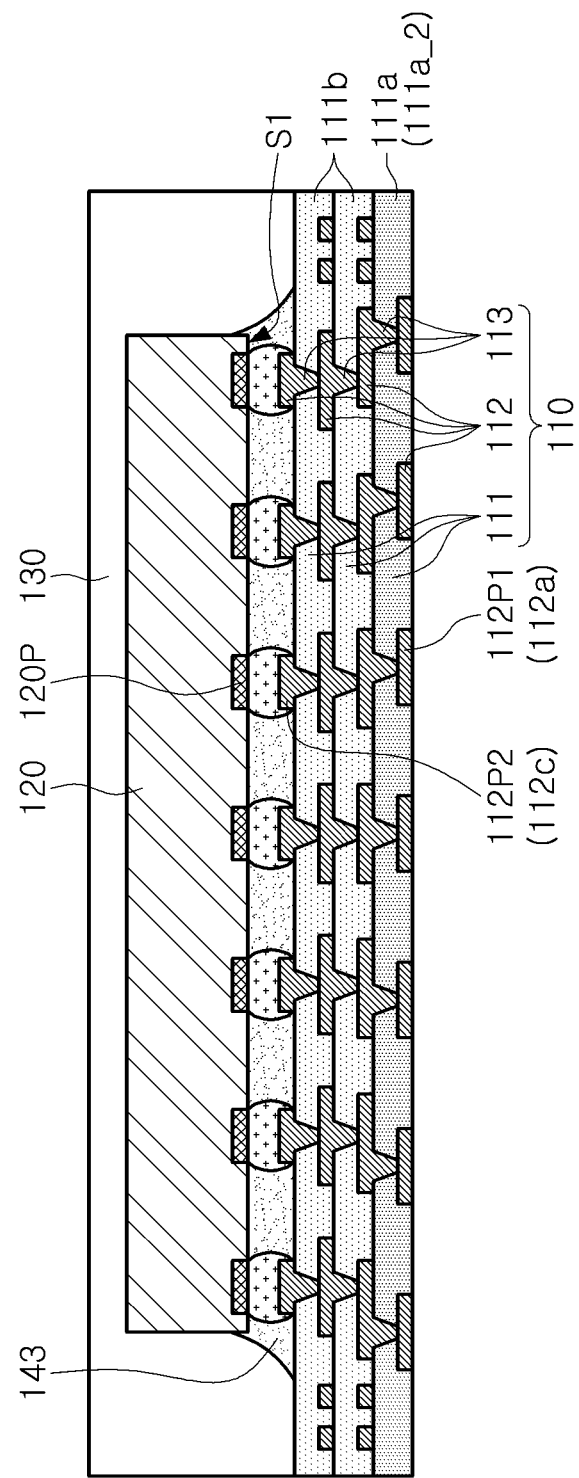

Referring to FIG. 6E, after removing the carrier C of FIG. 6D, the first lower insulating layer 111a1 may be etched to expose the lowermost redistribution layer 112a or the first pad 112P1. The first pad 112P1 may be buried in the first upper insulating layer 111a_2 such that the lower surface thereof is on substantially the same level as a lower surface of the first upper insulating layer 111a_2 or is located at a level between the lower surface and an upper surface of the first upper insulating layer 111a_2. Thereafter, a connection bump such as a solder ball may be formed on the first pad 112P1.

Figure 7:
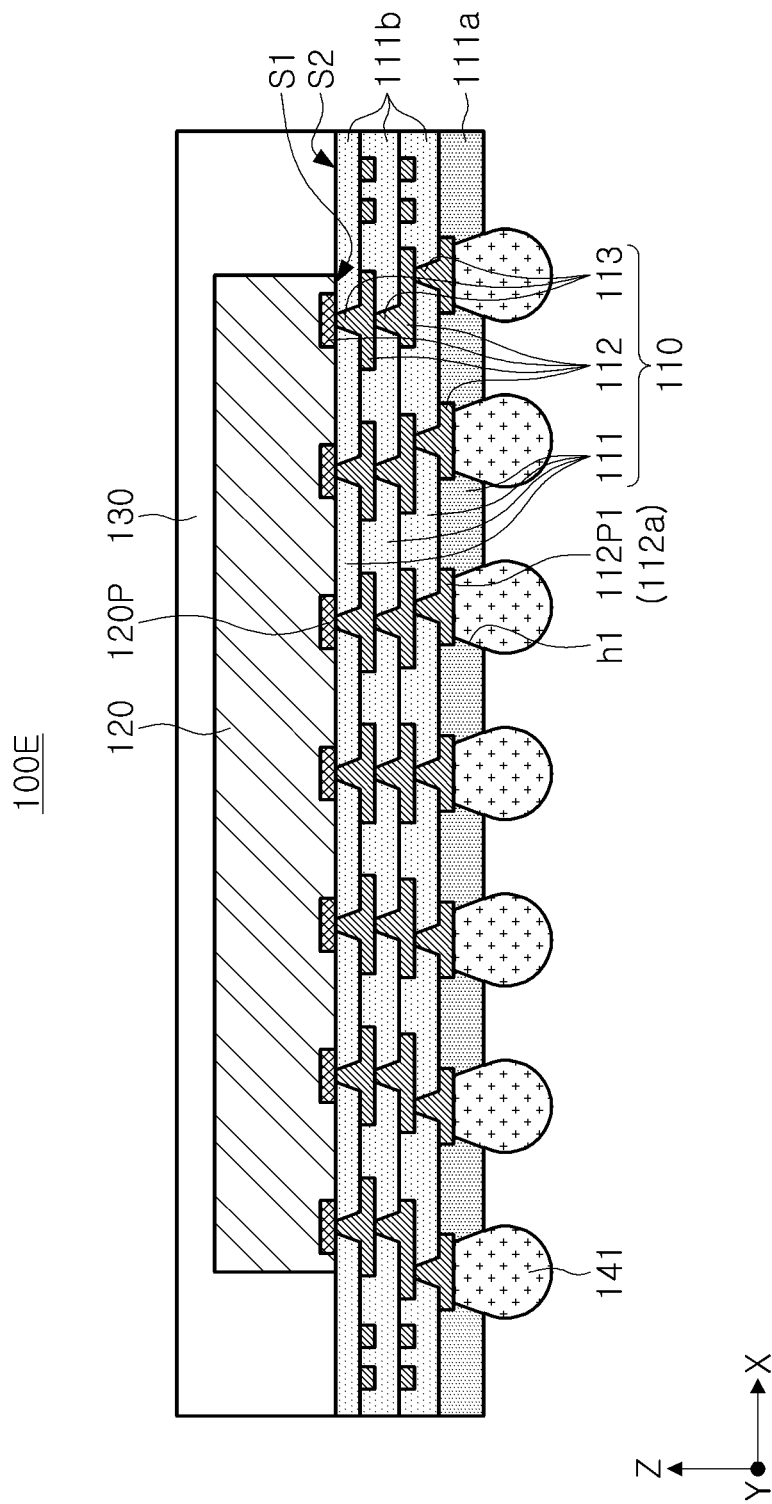
FIG. 7 is a cross-sectional view illustrating a semiconductor package according to an example embodiment of the present inventive concept.

FIG. 7 is a cross-sectional view illustrating a semiconductor package 100E according to an example embodiment of the present inventive concept.

Referring to FIG. 7, in the semiconductor package 100E, a first surface S1 of the semiconductor chip 120 on which the connection pads 120P are disposed may contact an upper surface S2 of the redistribution substrate 110. In addition, the redistribution substrate 110 may include a redistribution via 113 penetrating through an uppermost second insulating layer among the plurality of second insulating layers 111b to connect the connection pad 120P and the redistribution layer 112. For example, the redistribution substrate 112 may include a first insulating layer 111a and a second insulating layer 111b stacked in a vertical direction (Z direction), and a redistribution layer 112 disposed in the first insulating layer 111a and the second insulating layer 111b. The semiconductor chip 120 may be disposed on the redistribution substrate 110 so that the first surface S1 thereof faces the second insulating layer 111b, and the connection pad 120P may be directly connected to the redistribution via 113 penetrating through the second insulating layer 111b. In an example embodiment, the plurality of redistribution vias 113 may have a tapered shape, a width of which in the horizontal direction (X direction) decreases in the stacking direction of the semiconductor chip 120. The term "contact" or "in contact with," as used herein, refers to a direct connection (i.e., touching) without any intervening elements present at the point of contact unless the context indicates otherwise.

The first insulating layer 111a and the second insulating layer 111b may include a first insulating resin and a second insulating resin, respectively. The first insulating resin may have an elongation of 60% or more and toughness of 70 mJ/mm$^3$ or more, and the second insulating resin may have an elongation in a range of 10% to 40% and toughness in a range of 10 mJ/mm$^3$ to 40 mJ/mm$^3$. In an example embodiment, a lowermost redistribution layer 112a of the plurality of redistribution layers 112 may be disposed on the lowermost second insulating layer 111b, and may be buried in the first insulating layer 111a. The first insulating layer 111a may have a plurality of openings h1 exposing at least a portion of the lowermost redistribution layer 112a. A plurality of connection bumps 141 may be disposed in the plurality of openings h1 of the first insulating layer 111a, respectively.

The plurality of connection bumps 141 may be electrically connected to at least a portion of the redistribution layer 112a exposed from (i.e., via the thole h1) the first insulating layer 111a. In an example embodiment, at least a portion of the plurality of connection bumps 141 may be disposed in a fan-out region. For example, a horizontal width (X or Y direction) of the redistribution substrate 110 may be greater than a horizontal width (X or Y direction) of the semiconductor chip 120, and at least a portion of the plurality of connection bumps 141 may not overlap the semiconductor chip 120 in a direction (Z direction), perpendicular to the first surface S1 of the semiconductor chip 120. In an example embodiment, the redistribution layer 112 may redistribute the connection pad 112P of the semiconductor chip 120 to the fan-out region.

Figure 8:
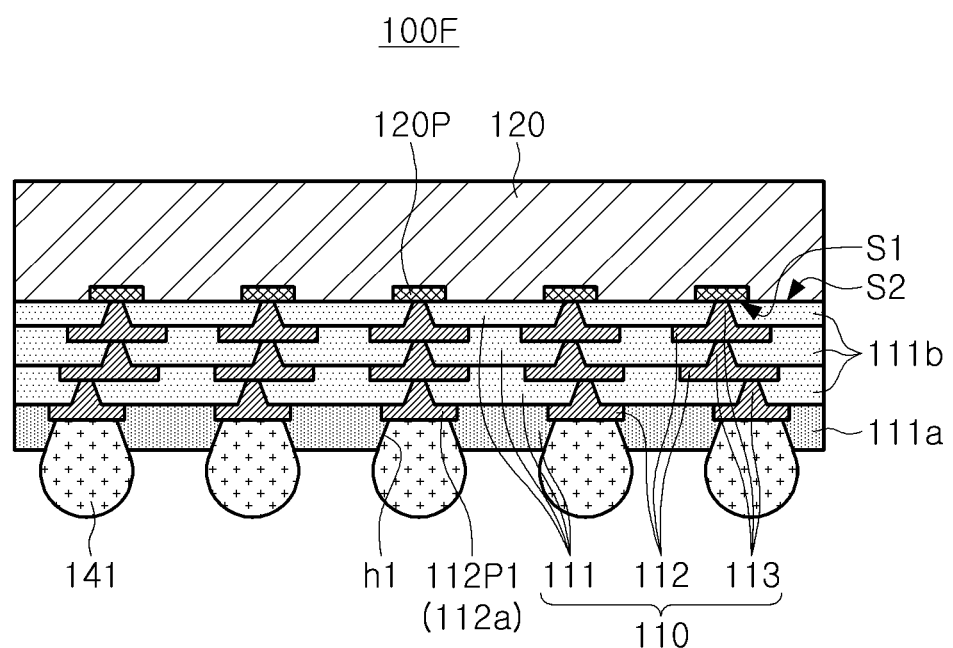
FIG. 8 is a cross-sectional view illustrating a semiconductor package according to an example embodiment of the present inventive concept.

FIG. 8 is a cross-sectional view illustrating a semiconductor package 100F according to an example embodiment of the present inventive concept.

Referring to FIG. 8, in the semiconductor package 100F, a plurality of connection bumps 141 may be disposed in a fan-in region. For example, a width (X direction or Y direction) of the redistribution substrate 110 may be substantially the same as a width (X direction or Y direction) of the semiconductor chip 120, and the plurality of connection bumps 141 may overlap the semiconductor chip 120 in a direction (Z direction), perpendicular to the first surface S1 of the semiconductor chip 120.

In an example embodiment, the semiconductor package 100F may have a redistribution structure, similar to the semiconductor package 100E of FIG. 7. For example, the first surface S1 of the semiconductor chip 120 may be in contact with an upper surface S2 of the redistribution substrate 110. In addition, the redistribution substrate 110 may include a first insulating layer 111a and a second insulating layer 111b stacked in a vertical direction (Z direction), and may include a redistribution layer 112 disposed in the first insulating layer 111a and the second insulating layer 111b. The semiconductor chip 120 may be disposed on the redistribution substrate 110 so that the first surface S1 faces the second insulating layer 111b, and the connection pad 120P may be directly connected to a redistribution via 113 penetrating through the second insulating layer 112b. The plurality of redistribution vias 113 may have a tapered shape, a width of which in a horizontal direction (X direction) decreases in a stacking direction of the semiconductor chip 120.

Figure 9:
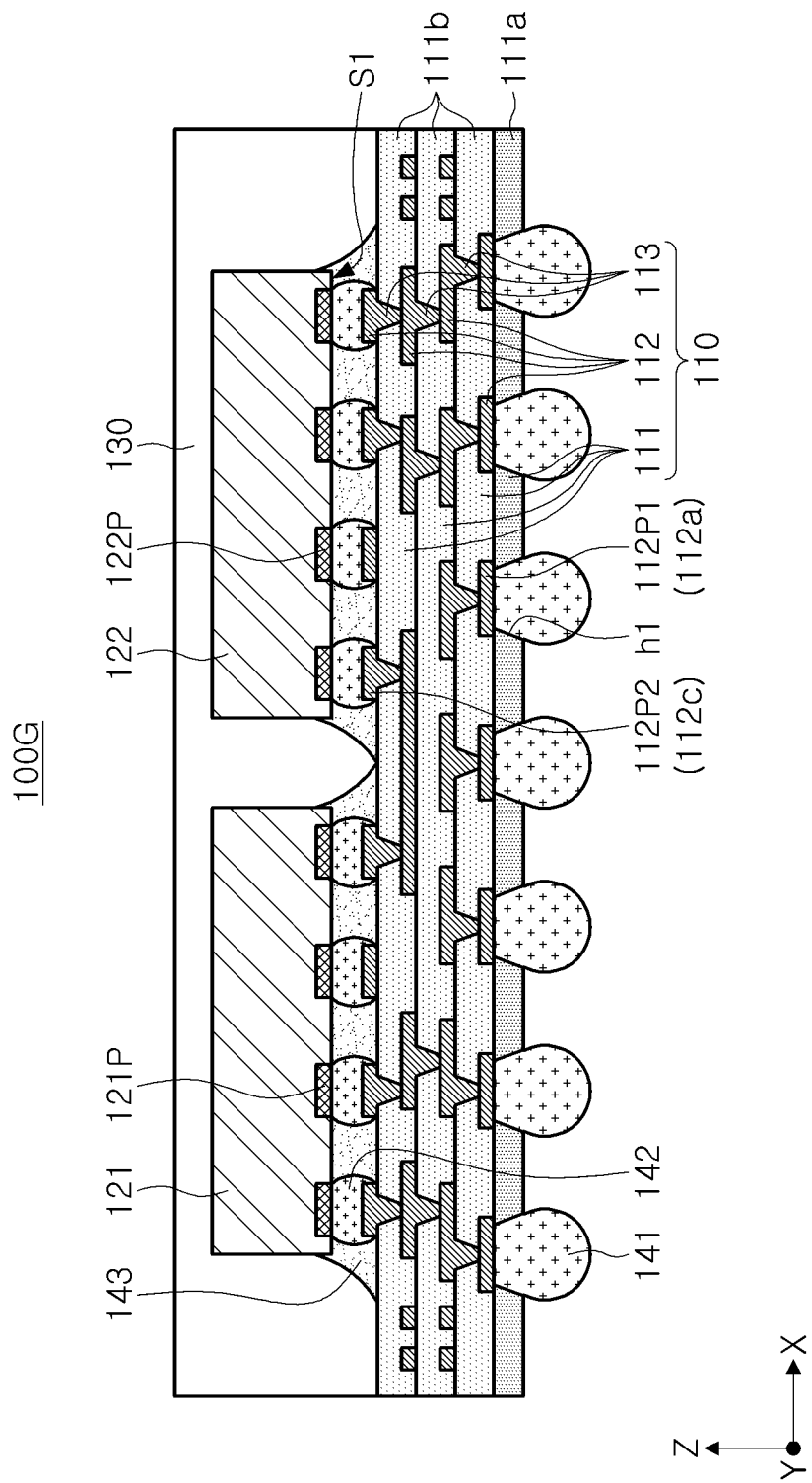
FIG. 9 is a cross-sectional view illustrating a semiconductor package according to an example embodiment of the present inventive concept.

FIG. 9 is a cross-sectional view illustrating a semiconductor package 100G according to an example embodiment of the present inventive concept.

Referring to FIG. 9, the semiconductor package 100G may include a plurality of semiconductor chips 121 and 122 mounted on a redistribution substrate 110. a plurality of semiconductor chips 121 and 122 may be disposed adjacent to each other in a horizontal direction (X or Y direction) or may be stacked in a vertical direction (Z direction). For example, the semiconductor package 100G may include a first semiconductor chip 121 disposed on the redistribution substrate, and including a first connection pad 121P electrically connected to the redistribution layer 112, and a second semiconductor chip 122 disposed adjacent to the first semiconductor chip 121 on the redistribution substrate 110, and including a second connection pad 122P electrically connected to the redistribution layer 112. The first connection pad 121P and the second connection pad 122P may be electrically connected to each other through the redistribution layer 112.

The first and second semiconductor chips 121 and 122 may include different types of semiconductor chips. For example, the first semiconductor chip 121, may include, for example, a central processor (for example, a central processing unit (CPU)), a graphics processor (for example, a graphics processing unit (GPU)), a field programmable gate array (FPGA), a digital signal processor (DSP), a cryptographic processor, a microprocessor, a microcontroller, and a logic chip such as an analog-digital converter, and an application-specific IC (ASIC), and the like. The second semiconductor chip 122, may include, for example, a volatile memory chip such as DRAM or SRAM, a nonvolatile memory chip such as PRAM, MRAM, RRAM, and flash memory chip, or a high-performance memory device such as a high bandwidth memory (HBM), a hybrid memory cubic (HMC), and the like.

Figure 10:
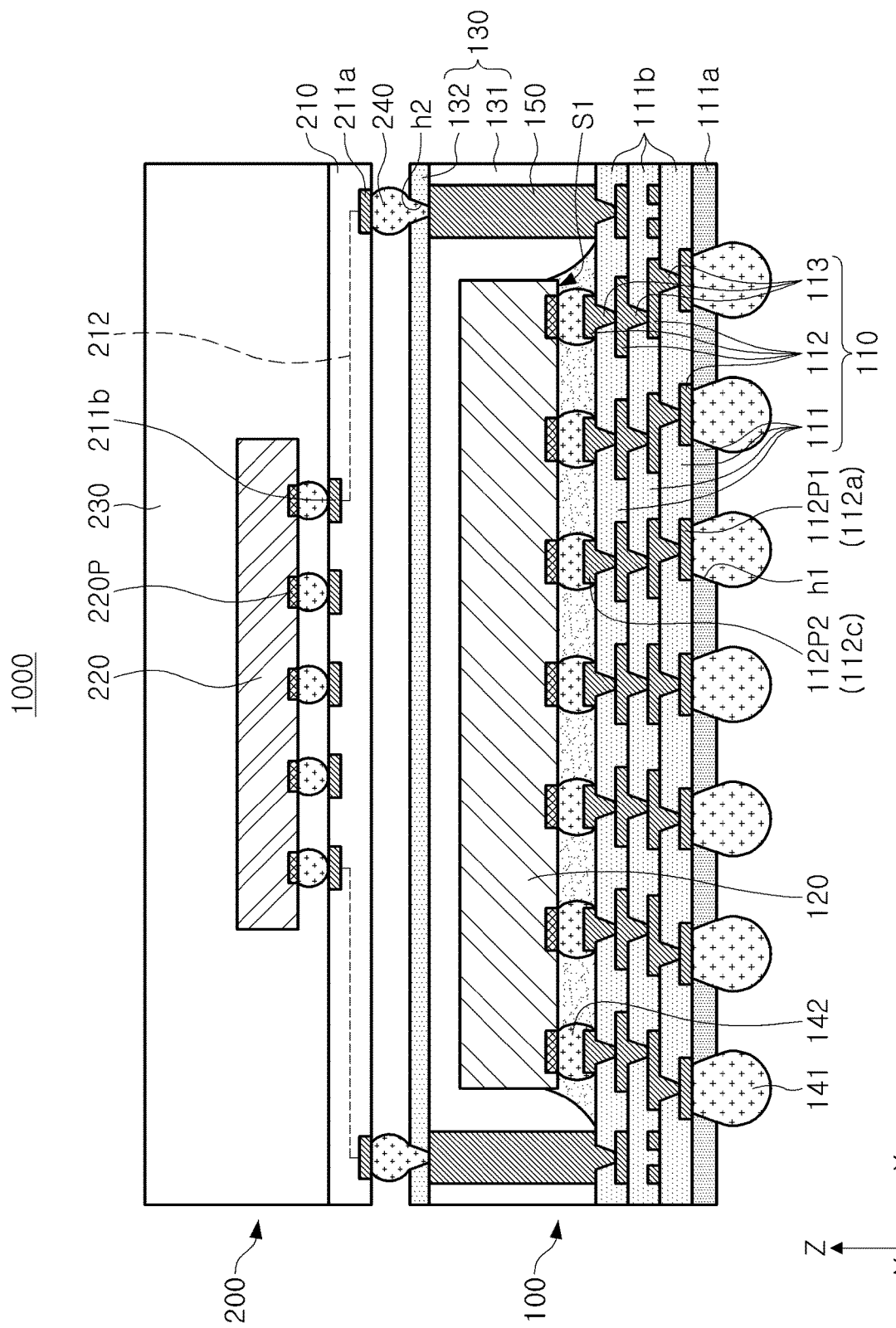
FIG. 10 is a cross-sectional view illustrating a semiconductor package according to an example embodiment of the present inventive concept.

FIG. 10 is a cross-sectional view illustrating a semiconductor package 1000 according to an example embodiment of the present inventive concept.

Referring to FIG. 10, a semiconductor package 1000 may include a first package 100 and a second package 200 coupled to an upper portion of the first package 100. The first package 100 may include a vertical connection structure 150 disposed on the redistribution substrate 110. In accordance with varying example embodiments of the present inventive concept, vertical connection structure 150 may also be disposed in the semiconductor packages 100A, 100B, 100C, 100D, 100E, 100F, and 100G shown in FIGS. 1B, 3A, 3B, 4, 7, 8, 9, and the like. At least a portion of a surface of the vertical connection structure 150 may be covered by the encapsulant 130. The vertical connection structure 150 may be electrically connected to the redistribution layer 112. The vertical connection structure 150 may be in a form of a post by which a conductor penetrates through a portion of the encapsulant 140, or may have a multilayer substrate form (e.g., a printed circuit board (PCB)) in which an insulating layer and a conductive layer are sequentially stacked.

The vertical connection structure 150 may provide an electrical connection path passing through the first package 100 in a vertical direction (Z direction). The vertical connection structure 150 may be connected to a metal bump 240 through an opening h2 in an upper portion of the encapsulant 130. The encapsulant 130 may include a first encapsulant 131 surrounding a side surface of the vertical connection structure 150 and a second encapsulant 132 on the first encapsulant 131. The first encapsulant 131 and the second encapsulant 132 may include different materials. For example, the first encapsulant 131 may include EMC, and the second encapsulant 132 may include PID. Alternatively, the first and second encapsulants 131 and 132 may also include the same type of insulating material. In a modified example, the upper surface of the semiconductor chip 120 may also be exposed by polishing the upper portion of the first encapsulant 131. In addition, a rear redistribution layer for physically and electrically connecting the vertical connection structure 150 and the metal bump 240 may be further formed on the second encapsulant 132.

The second package 200 may include a second redistribution substrate 210, a second semiconductor chip 220, and a second encapsulant 230. The second redistribution substrate 210 may include redistribution pads 211a and 211b that may be electrically connected externally on a lower surface and an upper surface thereof, respectively. In addition, the second redistribution substrate 210 may include a redistribution circuit 212 connected to the redistribution pads 211a and 211b therein. The redistribution circuit 212 may redistribute the connection pad 220P of the second semiconductor chip 220 to the fan-out region.

The second semiconductor chip 220 includes a connection pad 220P connected to an internal integrated circuit, and the connection pad 220P may be electrically connected to a second redistribution structure 210 through a connection member. The connection member may include a conductive bump or a conductive wire. For example, the connection member may be a solder ball. In a modified example, the connection pad 220P of the second semiconductor chip 220 may contact an upper surface of the second redistribution substrate 210, and may be electrically connected to a redistribution circuit 212 through vias inside the second redistribution substrate 210.

The second encapsulant 230 may include a material the same as or similar to the first encapsulant 140 of the first package 100. The second package 200 may be physically and electrically connected to the first package 100 by a metal bump 240.

The metal bump 240 may be electrically connected to a redistribution circuit 212 inside a second redistribution substrate 210 through a redistribution pad 211a on the lower surface of the second redistribution substrate 210. The metal bump 240 may be made of a low melting point metal, for example, tin (Sn) or an alloy including tin (Sn).

In an example embodiment, a lowermost insulating layer 111a of the first redistribution substrate 110 may include a photosensitive resin having an elongation of 60% or more and toughness of 70 mJ/mm$^3$ or more. In addition, the second redistribution substrate 210 of the second package 200, may include an outermost insulating layer exposing the lower redistribution pad 211a. The outermost insulating layer may also include a photosensitive resin having an elongation of 60% or more and toughness of 70 mJ/mm$^3$ or more. Accordingly, it is possible to prevent cracks from occurring in the outermost insulating layer on which bumps such as solder balls are disposed.

Figure 11:
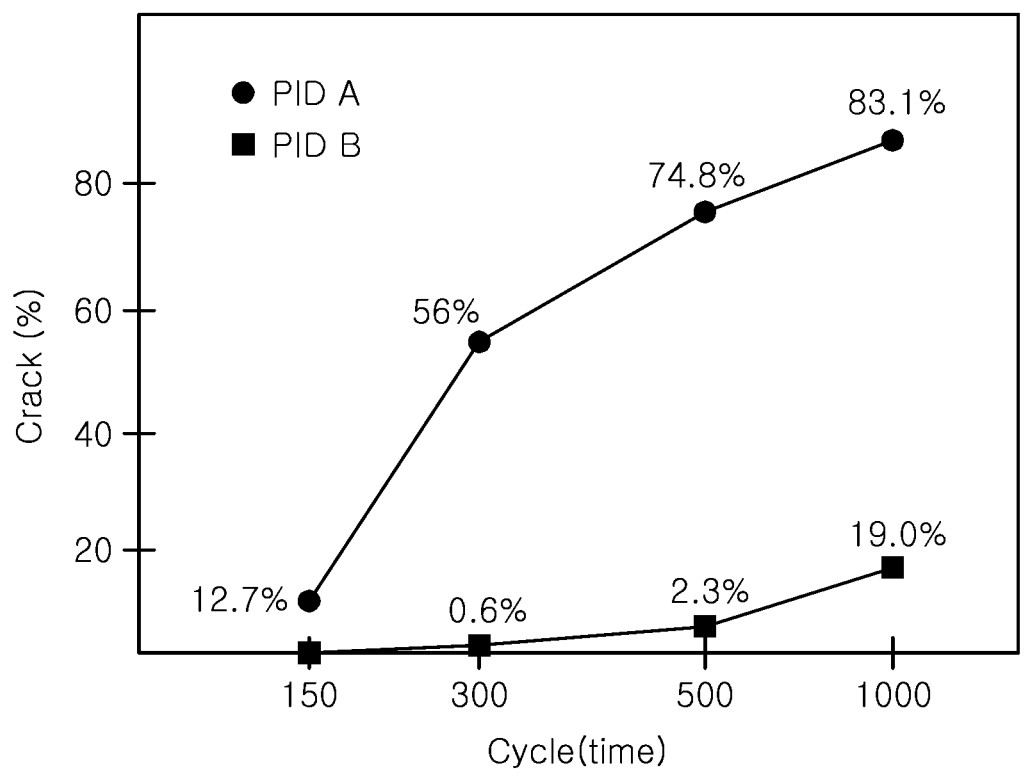
FIG. 11 is a graph illustrating a reliability test result according to physical properties of an outermost insulating layer.

FIG. 11 is a graph illustrating a reliability test result according to the physical properties of the outermost insulating layer. FIG. 11 shows a temperature cycling (TC) reliability test of a redistribution substrate including a first photosensitive resin (PID A) and a second photosensitive resin (PID B), respectively, as the outermost insulating layer (e.g., "111a" in FIG. 1B). Here, the first photosensitive resin (PID A) has an elongation of about 40% and toughness of about 41.2 mJ/mm$^3$, and the second photosensitive resin (PID B) has an elongation of about 76% and toughness of about 86.5 mJ/mm$^3$. In the graph of FIG. 11, a horizontal axis represents the number of cycle repetitions and a vertical axis represents a probability of occurrence of cracks. The TC reliability tests were carried out with temperature conditions −55° C. to +125° C.

Referring to FIG. 11, the probability of occurrence of cracks in a substrate including the first photosensitive resin (PID A) increases rapidly as cycling increases, whereas the probability of occurrence of cracks in a substrate including the second photosensitive resin (PID B) is remarkably low.

As set forth above, according to example embodiments of the present inventive concept, a semiconductor package having improved reliability may be provided by introducing an insulating resin having specific physical properties in an outermost insulating layer of the package.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:
1. A semiconductor package, comprising:
a redistribution substrate including a first insulating layer, one or more second insulating layers on the first insulating layer, and a plurality of redistribution layers disposed on each of the first insulating layer and the one or more second insulating layers, and electrically connected to each other;
a semiconductor chip disposed on the redistribution substrate, and including a connection pad electrically connected to the plurality of redistribution layers;
an encapsulant disposed on the redistribution substrate, and covering the semiconductor chip;

a first connection bump disposed on the redistribution substrate opposite to the semiconductor chip, and electrically connected to the plurality of redistribution layers; and a second connection bump disposed between the redistribution substrate and the semiconductor chip, and electrically connecting the plurality of redistribution layers and the connection pad, wherein the first insulating layer comprises a first photosensitive resin, the first photosensitive resin having an elongation of 60% or more and a toughness of 70 mJ/mm3 or more, wherein the one or more second insulating layers comprise a second photosensitive resin, the second photosensitive resin having an elongation in a range of 10% to 40% and a toughness in a range of 10mJ/mm3 to 40mJ/mm3, wherein a lowermost redistribution layer among the plurality of redistribution layers includes a first pad in contact with the first connection bump, wherein a lower surface of the first insulating layer is located at the same level as a lower surface of the first pad or between an upper surface of the first pad and the lower surface of the first pad, and wherein the first insulating layer does not contact the first connection bump.

2. The semiconductor package of claim 1, wherein the redistribution substrate further includes a third insulating layer on the one or more second insulating layers, an uppermost redistribution layer among the plurality of redistribution layers includes a second pad connected to the second connection bump and protruding on the third insulating layer, wherein the third insulating layer comprises the first photosensitive resin.

3. The semiconductor package of claim 1, wherein an uppermost redistribution layer among the plurality of redistribution layers includes a first second pad connected to the second connection bump, and the second pad protrudes on an uppermost second insulating layer among the one or more second insulating layers.

4. The semiconductor package of claim 1, wherein the semiconductor chip has a first surface facing the redistribution substrate, and the connection pad is disposed on the first surface.

5. The semiconductor package of claim 1, wherein the redistribution substrate further includes a redistribution via penetrating through the first insulating layer and at least a portion of the one or more second insulating layers to connect the plurality of redistribution layers to each other.

6. The semiconductor package of claim 1, further comprising an underfill resin filling a space between the redistribution substrate and the semiconductor chip, and surrounding the second connection bump.

7. The semiconductor package of claim 1, wherein the first insulating layer is an outermost insulating layer of the semiconductor package.

8. A semiconductor package, comprising:
a redistribution substrate including a first insulating layer and a second insulating layer stacked in a vertical direction, and a plurality of redistribution layers disposed in the first insulating layer and the second insulating layer;
a semiconductor chip, having a first surface on which a connection pad is disposed, disposed on the redistribution substrate in such a manner that the first surface faces the second insulating layer; and
an encapsulant covering the redistribution substrate and the semiconductor chip, wherein the first insulating layer comprises a first insulating resin, wherein the second insulating layer comprises a second insulating resin, wherein the first insulating resin has elongation and a toughness greater than the second insulating resin, wherein a lowermost redistribution layer among the plurality of redistribution layers includes a first pad connected to a first connection bump, wherein a lower surface of the first insulating layer is located at the same level as a lower surface of the first pad or between an upper surface of the first pad and the lower surface of the first pad, and wherein the first insulating layer does not contact the first connection bump.

9. The semiconductor package of claim 8, wherein the first insulating resin has an elongation of 60% or more and a toughness of 70 mJ/mm3 or more, and the second insulating resin has an elongation in a range of 10% to 40% and a toughness in a range of 10mJ/mm3 to 40mJ/mm3.

10. The semiconductor package of claim 8, wherein the first surface of the semiconductor chip is in contact with an upper surface of the redistribution substrate.

11. The semiconductor package of claim 8, wherein the redistribution substrate further includes a redistribution via penetrating through the second insulating layer and connecting the connection pad and the redistribution layer.

12. The semiconductor package of claim 8, further comprising a plurality of connection bumps disposed on a lower surface of the redistribution substrate.

13. The semiconductor package of claim 12, wherein a horizontal width of the redistribution substrate is greater than a horizontal width of the semiconductor chip, and at least a portion of the plurality of connection bumps do not overlap the semiconductor chip in a direction, perpendicular to the first surface of the semiconductor chip.

14. The semiconductor package of claim 12, wherein a horizontal width of the redistribution substrate is substantially the same as a horizontal width of the semiconductor chip, and the plurality of connection bumps overlap the semiconductor chip in a direction, perpendicular to the first surface of the semiconductor chip.

15. A semiconductor package, comprising:
a redistribution substrate including one or more first insulating layers, one or more second insulating layers stacked on the one or more first insulating layers, and a plurality of redistribution layers disposed in the one or more first and second insulating layers; and
a first semiconductor chip disposed on the redistribution substrate, and including a first connection pad electrically connected to the plurality of redistribution layers, wherein the one or more first insulating layers comprise a first insulating resin, wherein the one or more second insulating layers comprise a second insulating resin, wherein the first insulating resin has an elongation of 60% or more and a toughness of 70mJ/mm3 or more, wherein a lowermost redistribution layer among the plurality of redistribution layers includes a first pad in contact with a first connection bump, wherein a lower surface of the first insulating layer is located at the same level as a lower surface of the first pad or between an upper surface of the first pad and the lower surface of the first pad, and wherein the first insulating layer does not contact the first connection bump.

16. The semiconductor package of claim 15, wherein the elongation and the toughness of the second insulating resin is less than an elongation and a toughness of the first insulating resin.

17. The semiconductor package of claim 15, wherein the first insulating resin and the second insulating resin include a photosensitive resin, respectively.

18. The semiconductor package of claim 15, further comprising a second semiconductor chip disposed adjacent to the first semiconductor chip on the redistribution substrate, and including a second connection pad electrically connected to the plurality of redistribution layers, wherein the first connection pad and the second connection pad are electrically connected to each other through the plurality of redistribution layers.

* * * * *